US012652898B2

(12) United States Patent
Zhu et al.

(10) Patent No.: US 12,652,898 B2
(45) Date of Patent: Jun. 9, 2026

(54) PIXEL AND LENS ARRANGEMENTS FOR STEREOSCOPIC DISPLAY

(71) Applicant: BOE Technology Group Co., Ltd., Beijing (CN)

(72) Inventors: Jinye Zhu, Beijing (CN); Lin Li, Beijing (CN); Zhongxiao Li, Beijing (CN); Pengxia Liang, Beijing (CN); Sen Ma, Beijing (CN); Fang Cheng, Beijing (CN); Tao Hong, Beijing (CN); Jian Gao, Beijing (CN); Jing Yu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 570 days.

(21) Appl. No.: 18/043,402

(22) PCT Filed: Mar. 3, 2022

(86) PCT No.: PCT/CN2022/079123
§ 371 (c)(1),
(2) Date: Feb. 28, 2023

(87) PCT Pub. No.: WO2022/262323
PCT Pub. Date: Dec. 22, 2022

(65) Prior Publication Data
US 2024/0030274 A1      Jan. 25, 2024

(30) Foreign Application Priority Data
Jun. 17, 2021      (CN) .......................... 202110671914.0

(51) Int. Cl.
*H10H 29/14*        (2025.01)
*G02B 27/12*        (2006.01)
(Continued)

(52) U.S. Cl.
CPC ......... *H10H 29/142* (2025.01); *G02B 27/123* (2013.01); *G02B 30/27* (2020.01); *H10H 20/855* (2025.01)

(58) Field of Classification Search
CPC .. H10H 29/142; H10K 59/121; G02B 27/123; G02B 30/27–29; H04N 13/305
See application file for complete search history.

(56) References Cited

U.S. PATENT DOCUMENTS

2005/0083246 A1    4/2005  Saishu et al.
2008/0238545 A1    10/2008  Sauer
(Continued)

FOREIGN PATENT DOCUMENTS

CN        111684512 A      9/2020
CN        216249824 U      4/2022
WO        2022262323 A1    12/2022

OTHER PUBLICATIONS

Indian Office Action, mailed Mar. 7, 2024, from India Patent Application No. 202347028131, 7 pages.

*Primary Examiner* — Aaron J Gray
(74) *Attorney, Agent, or Firm* — Workman Nydegger

(57)        ABSTRACT

A display apparatus, including: the display panel includes multiple pixel islands arranged at intervals in a row direction and a column direction; odd rows of pixel islands and even rows of pixel islands are staggered in the row direction, and odd adjacent boundaries, extending in the column direction, of any two adjacent odd and even columns of pixel islands are colinearly arranged. Each pixel island includes multiple sub-pixels arranged at intervals in the row direction and the column direction, rows of sub-pixels in each pixel island are staggeredly arranged in sequence in the row direction, and adjacent boundaries, extending in the column direction, of any two adjacent columns the sub-pixels are collinearly arranged; and the light-splitting assembly is at a display
(Continued)

surface side of the display panel and includes multiple lenses that extend in the column direction and are arranged at intervals in the row direction.

13 Claims, 5 Drawing Sheets

(51) Int. Cl.
  *G02B 30/27*        (2020.01)
  *H10H 20/855*      (2025.01)

(56)                References Cited

U.S. PATENT DOCUMENTS

| | | | |
|---|---|---|---|
| 2014/0029095 A1* | 1/2014 | Allio .................... | H04N 13/398 |
| | | | 359/464 |
| 2020/0058624 A1* | 2/2020 | Su ......................... | H10W 90/00 |
| 2021/0033790 A1* | 2/2021 | Ward ................. | G02B 6/12007 |

* cited by examiner

PIXEL AND LENS ARRANGEMENTS FOR STEREOSCOPIC DISPLAY

CROSS REFERENCE TO RELATED APPLICATIONS

The present application is a national phase entry under 35 U.S.C § 371 of International Application No. PCT/CN2022/079123, filed Mar. 3, 2022, which claims the priority to Chinese Patent Application No. 202110671914.0, filed to the China National Intellectual Property Administration on Jun. 17, 2021 and entitled "DISPLAY APPARATUS", which is incorporated in its entirety herein by reference.

FIELD

The present disclosure relates to the field of display, and particularly relates to a display apparatus.

BACKGROUND

Based on binocular parallax, a naked-eye three dimensional (3D) display technology allows people to see vivid stereoscopic images in two dimensions of space and depth without any auxiliary device (for example, 3D glasses). Since the stereoscopic images displayed by a naked-eye 3D display apparatus features real and vivid expression, superior environmental experience and impressive visual impact, the naked-eye 3D display apparatus has been applied to increasing scenarios.

SUMMARY

A specific solution of a display apparatus provided in embodiments of the present disclosure is as follows.

The embodiments of the present disclosure provide a display apparatus, including:

a display panel including a plurality of pixel islands arranged at intervals in a row direction and a column direction, where odd rows of pixel islands and even rows of pixel islands are staggered in the row direction, and adjacent boundaries, extending in the column direction, of any two adjacent odd and even columns of pixel islands are colinearly arranged; and each of the plurality of pixel islands includes a plurality of sub-pixels arranged at intervals in the row direction and the column direction, rows of sub-pixels in each pixel island are staggered in sequence in the row direction, and adjacent boundaries of any two adjacent columns of sub-pixels extending in the column direction are colinearly arranged; and a light-splitting assembly located at a display surface side of the display panel and including a plurality of lenses extending in the column direction and arranged at intervals in the row direction, where every two adjacent lenses constitute a light-splitting repeating unit; and one lens is arranged corresponding to one column of pixel islands, and main lobe viewing angles formed after emitted rays of two columns of pixel islands corresponding to each light-splitting repeating unit pass corresponding lenses respectively are in close contact.

Optionally, in the display apparatus provided in the embodiments of the present disclosure, the plurality of sub-pixels include light-emitting sub-pixels and floating sub-pixels, where in each row of sub-pixels of each pixel island, a distance between a light-emitting sub-pixel and a central axis, extending in the column direction, of the pixel island is smaller than a distance between a floating sub-pixel and the central axis, extending in the column direction, of the pixel island.

Optionally, in the display apparatus provided in the embodiments of the present disclosure, the lenses cover the light-emitting sub-pixels of the corresponding pixel islands and do not cover the floating sub-pixels of the corresponding pixel islands, and a central axis, extending in the column direction, of the lens deviates from a central axis, extending in the column direction, of a corresponding column of pixel islands.

Optionally, in the display apparatus provided in the embodiments of the present disclosure, viewpoints formed after emitted rays of all the light-emitting sub-pixels corresponding to the light-splitting repeating unit pass respective corresponding lenses are arranged in sequence in the row direction in space.

Optionally, in the display apparatus provided in the embodiment of the present disclosure, relative to the light-splitting repeating unit, emitted rays of the light-emitting sub-pixels at the same positions pass the respective corresponding lenses and form a viewpoint.

Optionally, in the display apparatus provided in the embodiments of the present disclosure, the pixel island includes 27 sub-pixels, the 27 sub-pixels are arranged in 3 rows and 27 columns, and each row of sub-pixels include 8 light-emitting sub-pixels and 1 floating sub-pixel.

Optionally, in the display apparatus provided in the embodiments of the present disclosure, an emitted ray of the light-emitting sub-pixel having a smallest distance to the floating sub-pixel in each pixel island is totally reflected on a lens corresponding to an adjacent pixel island in the row direction.

Optionally, the display apparatus provided in the embodiments of the present disclosure further includes: a light shielding layer located at a side of the light-splitting assembly facing away from the display panel, where the light shielding layer includes a plurality of light shielding structures extending in the column direction, and the light shielding structures fill gaps between the lenses.

Optionally, the display apparatus provided in the embodiments of the present disclosure further includes a plurality of redundant sub-pixels, where the plurality of redundant sub-pixels are arranged in the same rows as at least part of the sub-pixels corresponding to one lens of the light-splitting repeating unit and in the same columns as at least part of the sub-pixels corresponding to another lens of the light-splitting repeating unit.

Optionally, in the display apparatus provided in the embodiments of the present disclosure, each sub-pixel has a width of 6.5 μm-1000 μm in the row direction, each sub-pixel has a length of 10 μm-2000 μm in the column direction, and every two adjacent rows of sub-pixels in the pixel islands have a distance of 4 μm-1000 μm.

Optionally, in the display apparatus provided in the embodiments of the present disclosure, every two adjacent rows of pixel islands have a distance greater than or equal to 70 μm.

Optionally, in the display apparatus provided in the embodiments of the present disclosure, the display panel includes a plurality of spliced mini light emitting diode (LED) display screens or a plurality of spliced micro LED display screens.

Optionally, in the display apparatus provided in the embodiments of the present disclosure, in two columns of pixel islands corresponding to the same light-splitting repeating unit, every six pixel islands arranged in sequence in the column direction constitute a pixel repeating unit; and in one pixel repeating unit, the six pixel islands display three colors, and every two adjacent pixel islands arranged in sequence in the column direction display the same color.

DETAILED DESCRIPTION OF THE EMBODIMENTS

Figure 1:
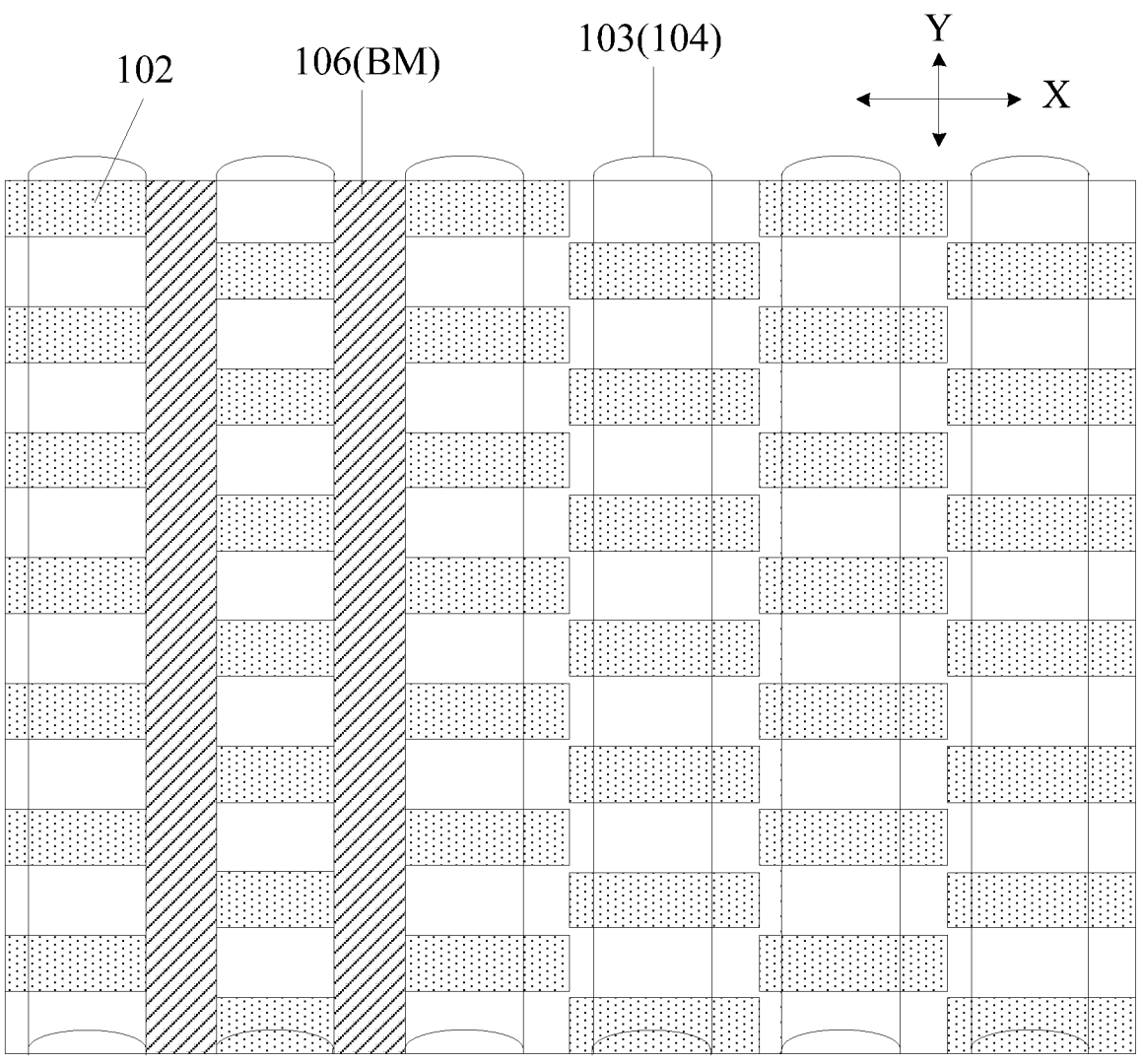
FIG. 1 is a schematic structural diagram of a display apparatus according to an embodiment of the present disclosure.

For making objectives, technical solutions and advantages of embodiments of the present disclosure clearer, the technical solutions of the embodiments of the present disclosure will be clearly and completely described below in conjunction with the accompanying drawings in the embodiments of the present disclosure. It should be noted that a size and a shape of each figure in the drawings do not reflect a true scale, but only for illustrating the present disclosure. Throughout the drawings, identical or similar reference numerals denote identical or similar elements or elements having identical or similar functions.

Unless otherwise defined, technical or scientific terms used herein should have ordinary meanings as understood by those of ordinary skill in the art to which the present disclosure belongs. "First", "second" and similar words used in the description and claims of the present disclosure do not indicate any order, amount or importance, but only for distinguishing different components. "Including", "comprising", and other similar words indicate that elements or objects before the word include elements or objects after the word and their equivalents, without excluding other elements or objects. "Inside", "outside", "upper", "lower", etc. are only used to indicate a relative positional relation. After an absolute position of the described object changes, the relative positional relation may also change accordingly.

A super multi-view three dimensional (3D) light field display technology may achieve naked-eye 3D display, and may better restore light field information and enhance visual experience. However, in the related art, a super multi-view 3D light field display apparatus has a small viewing angle, is only suitable for small-sized products, and cannot satisfy requirements of large-sized or medium-sized spliced display apparatuses.

To solve the technical problems existing in the related art, the embodiment of the present disclosure provides a display apparatus. As shown in FIG. 1, the display apparatus may include:

a display panel 101 including a plurality of pixel islands 102 arranged at intervals in a row direction X and a column direction Y, where odd rows of pixel islands 102 and even rows of pixel islands 102 are staggered in the row direction X, and adjacent boundaries, extending in the column, of any two adjacent odd column of pixel islands 102 and even column of pixel islands 102 are colinearly (that is, coincidently) arranged direction Y; each pixel island 102 includes a plurality of sub-pixels P arranged at intervals in the row direction X and the column direction Y, rows of sub-pixels P in the each pixel island is staggered in sequence in the row direction X, and adjacent boundaries, extending in the column direction Y, of any two adjacent columns of sub-pixels P are colinearly arranged; and optionally, the display panel 101 may be a large-sized or medium-sized display panel spliced from a plurality of mini light emitting diode (LED) display screens or a plurality of micro LED display screens; and a light-splitting assembly 103 located at a display surface side of the display panel 101 and including a plurality of lenses 104 extending in the column direction Y and arranged at intervals in the row direction X, where every two adjacent lenses 104 constitute a light-splitting repeating unit 105; one lens 104 is arranged corresponding to one column of pixel islands 102, and main lobe viewing angles formed after emitted rays of two columns of pixel islands 102 corresponding to each light-splitting repeating unit 105 pass the corresponding lenses 104 respectively are in close contact, the main lobe viewing angles referring to viewing angles formed in space after the emitted rays of the pixel islands 102 pass the lenses directly above the pixel islands and then are split by the lenses 104, and close contact indicating that the two main lobe viewing angles are in direct contact with each other in space without any overlapping area.

In the display apparatus provided in the embodiments of the present disclosure, the pixel islands 102 are staggered in the row direction X and in close contact in the column direction Y, and the plurality of sub-pixels P included in each pixel island 102 are staggered in the row direction X and in close contact in the column direction Y, so as to match the lens 104 corresponding to the pixel island 102, such that the main lobe viewing angles formed after the emitted rays of the two columns of pixel islands 102 corresponding to each light-splitting repeating unit 105 pass the corresponding lenses 104 respectively are in close contact. In this way, splicing of viewing angles is achieved, a viewing angle of light field display is increased, and watching of a plurality of people may be achieved.

In addition, in the present disclosure, light is emitted continuously in the pixel islands 102 and between the pixel islands 102, such that the pixel islands 102 are projected to corresponding positions in space to form a continuous viewing angle, human eyes cannot see black areas when moving in the space, and then moire patterns generated in the black areas are eliminated.

In addition, compared with a liquid crystal display (LCD) product or an organic light emitting diode (OLED) product that conducts light field display with the sub-pixels P as units in the related art, the sub-pixels P of mini LED or micro LED may be made smaller, resolution of a single pixel island 102 is higher, and resolution of the display apparatus obtained by splicing the pixel islands 102 is high enough, such that the present disclosure may achieve light field display with higher resolution, more information and more delicate retinas.

Figure 2:
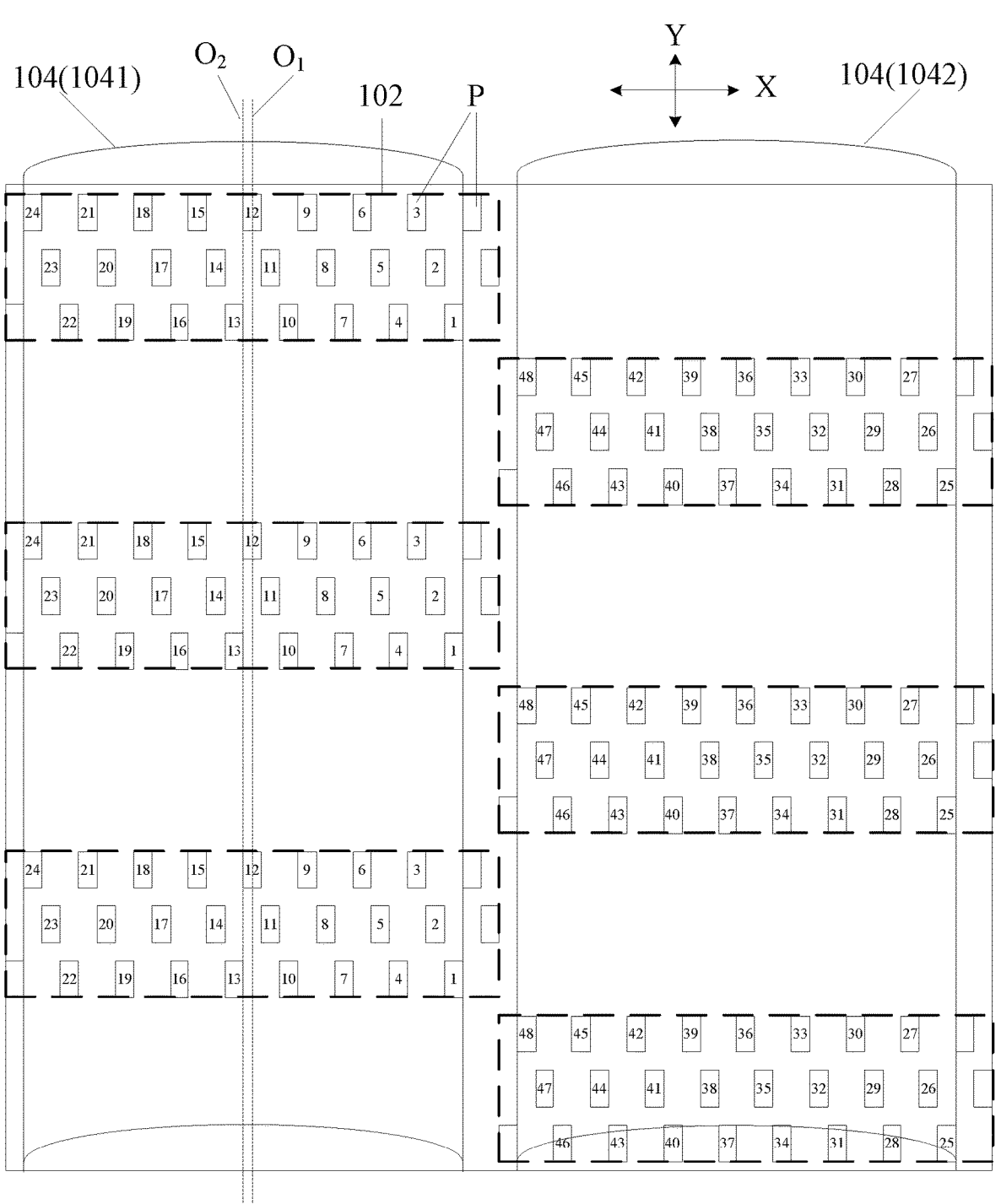
FIG. 2 is a schematic structural diagram of an area where one pixel repeating unit is located according to an embodiment of the present disclosure.

In some embodiments, in the display apparatus provided in the embodiments of the present disclosure, as shown in FIG. 2, a plurality of sub-pixels P in each pixel island 102 may include light-emitting sub-pixels (that is, sub-pixels numbered in FIG. 2) and floating sub-pixels (that is, sub-pixels not numbered in FIG. 2), where in each row of sub-pixels P of each pixel island 102, a distance between a light-emitting sub-pixel and a central axis $O_1$, extending in a column direction Y, of the pixel island 102 is smaller than a distance between a floating sub-pixel and the central axis $O_1$, extending in the column direction Y, of the pixel island 102, which is equivalent to that in each pixel island 102, the floating sub-pixels are located at an outer side of the light-emitting sub-pixels.

When light field display is conduced, emitted rays of lit light-emitting sub-pixels pass a lens 104 and form viewpoints in space; and the floating sub-pixels are non-light-emitting sub-pixels. In some embodiments, the floating sub-pixels may be controlled not to emit light via a pixel driving circuit. Considering process deviation and other factors, arrangement of the floating sub-pixels may satisfy a degree of freedom of splicing of viewing angles of the pixel islands 102, such that it is ensured that emitted rays of the light-emitting sub-pixels are continuous and crosstalk-free after passing corresponding lenses 104 and being emitted.

In some embodiments, in the display apparatus provided in the embodiments of the present disclosure, the floating sub-pixels are not used for light field display, in order to make the emitted rays of the light-emitting sub-pixels be split by the corresponding lens 104, as shown in FIG. 2, the lenses 104 may cover the light-emitting sub-pixels of the pixel islands 102 and not cover the floating sub-pixels of the pixel islands 102, and a central axis $O_2$, extending in the column direction Y, of the lens 104 deviates from the central axis $O_1$, extending in the column direction, of the corresponding column of pixel islands 102.

FIG. 2 shows that one pixel island 102 includes 27 sub-pixels P arranged in 3 rows and 27 columns, and each row of sub-pixels P include 8 light-emitting sub-pixels and 1 floating sub-pixel. One light-splitting repeating unit 105 includes two lenses 104, which are labeled as a first lens 1041 and a second lens 1042, respectively, where the first lens 1041 covers the light-emitting sub-pixels of one corresponding column of pixel islands 102 and does not cover the floating sub-pixels of the corresponding column of pixel islands 102; and the second lens 1042 covers the light-emitting sub-pixels of one corresponding column of pixel islands 102 and does not cover the floating sub-pixels of the corresponding column of pixel islands 102. 24 light-emitting sub-pixels included in each pixel island 102 corresponding to the first lens 1041 are labeled as a first light-emitting sub-pixel 1 to a 24th light-emitting sub-pixel 24, respectively, and 24 light-emitting sub-pixels included in each pixel island 102 corresponding to the second lens 1042 are labeled as a 25th light-emitting sub-pixel 25 to a 48th light-emitting sub-pixel 48, respectively. In addition, an arrangement mode that all the light-emitting sub-pixels and all the floating sub-pixels included in the pixel islands 102 corresponding to the first lens 1041 and the second lens 1042 are staggered in a row direction X and in close contact in the column direction Y, may be equivalent to an arrangement mode that all the light-emitting sub-pixels and all the floating sub-pixels are continuously and closely arranged in one row, as shown in FIG. 3.

The first light-emitting sub-pixel 1 to the 24th light-emitting sub-pixel 24 are in close contact, such that emergent rays generated after emitted rays of the first light-emitting sub-pixel 1 to the 24th light-emitting sub-pixel 24 pass the first lens 1041 are spatially continuous, to form a first main lobe viewing angle λ; and moreover, the 25th light-emitting sub-pixel 25 to the 48th light-emitting sub-pixel 48 are in close contact, such that emergent rays generated after emitted rays of the 25th light-emitting sub-pixel 25 to the 48th light-emitting sub-pixel 48 pass the second lens 1042 are spatially continuous, to form a second main lobe viewing angle δ. By setting an offset distance d between the central axis $O_2$, extending in the column direction Y, of the lens 104 and the central axis $O_1$, extending in the column direction, of the corresponding column of pixel islands 102 to satisfy the above formula, the first main lobe viewing angle λ and the second main lobe viewing angle δ are ensured to be in close contact, as shown in FIG. 3.

Figure 3:
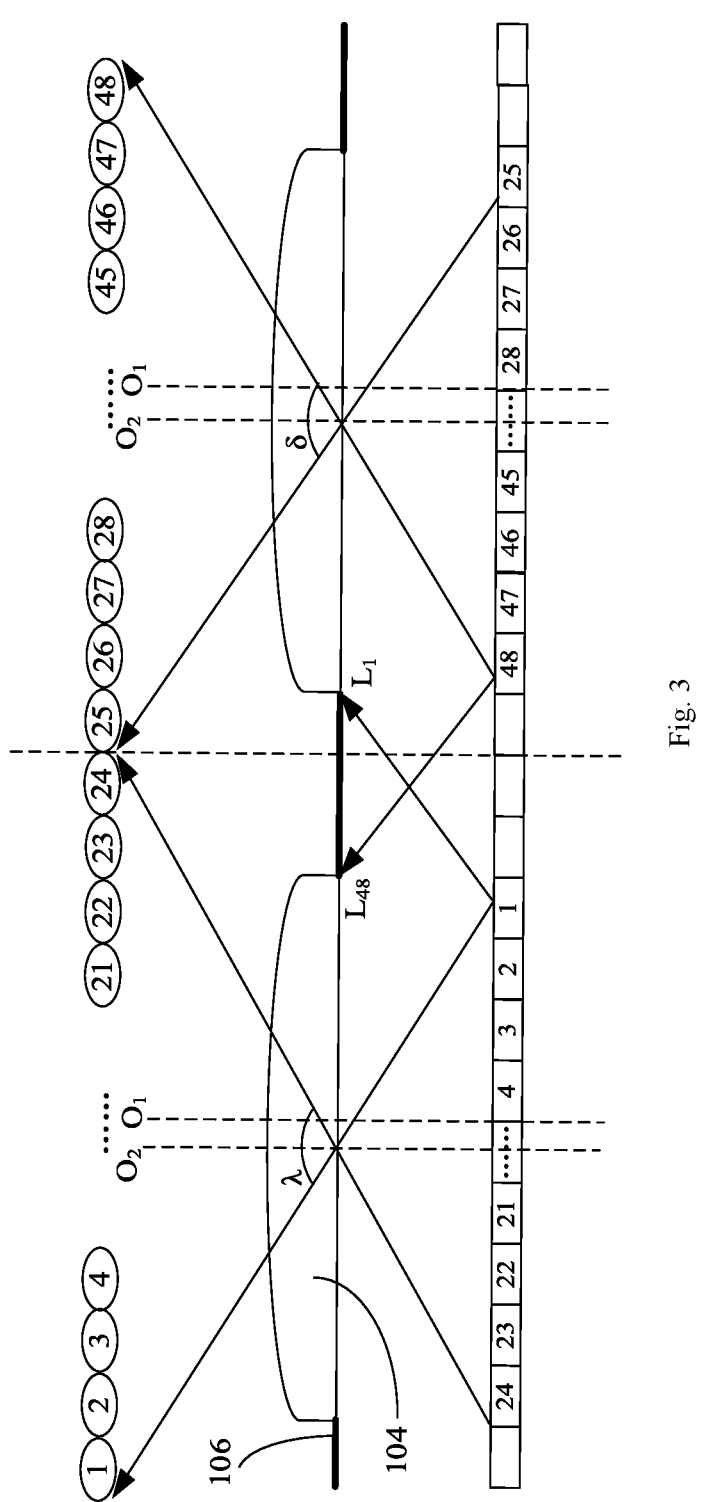
FIG. 3 is a schematic diagram showing that main lobe viewing angles of two columns of pixel islands corresponding to one light-splitting repeating unit are in close contact according to the embodiment of the present disclosure.

In addition, as shown in FIG. 3, it may be seen that positions of the first light-emitting sub-pixel 1 to the 24th light-emitting sub-pixel 24 relative to the corresponding lens 104 are different from each other, such that 24 viewpoints within a range of the first main lobe viewing angle λ may be formed via the corresponding lens 104, which are viewpoint 1 to viewpoint 24, respectively, that is, 24 pieces of light intensity information in different directions may be loaded in each pixel island 102. Similarly, the 25th light-emitting sub-pixel 25 to the 48th light-emitting sub-pixel 48 may form 24 viewpoints within a range of the second main lobe viewing angle δ through the corresponding lens 104, which are viewpoint 25 to viewpoint 48, respectively. Therefore, in the present disclosure, the first main lobe viewing angle λ is closely connected with the second main lobe viewing angle δ, such that 48 viewpoints arranged in sequence in the row direction X in space are obtained. In other words, viewpoints formed after emitted rays of all the light-emitting sub-pixels corresponding to one light-splitting repeating unit 105 pass the respective corresponding lenses 104 are arranged in sequence in the row direction X in space.

Moreover, in the display apparatus provided in the embodiments of the present disclosure, relative to the light-splitting repeating units 105, emitted rays of the light-emitting sub-pixels at the same positions pass the respective corresponding lenses 104 and form one viewpoint. In other words, in the present disclosure, all the light-emitting sub-pixels having the same number in all the pixel islands 102 form a viewpoint of the number. For example, the first light-emitting sub-pixels 1 in all the pixel islands 102 all form the viewpoints 1.

In some embodiments, in the display apparatus provided in the embodiments of the present disclosure, large-viewing-angle light field display may be achieved only through close contact of the main lobe viewing angles, in order to prevent an emitted ray of a light-emitting sub-pixel from passing a lens 104 next to the lens 104 directly above the light-emitting sub-pixel and forming a side lobe viewing angle in space, an emitted ray (for example, $L_1$ and $L_{48}$) of a light-emitting sub-pixel having a smallest distance to the floating sub-pixels in each pixel island 102 may totally reflected on the lens 104 corresponding to an adjacent pixel island 102 in the row direction X, as shown in FIG. 3.

In some embodiments, as shown in FIGS. 1 and 3, the display apparatus provided in the embodiments of the present disclosure may further include: a light shielding layer 106 located at a side of the light-splitting assembly 103 facing away from the display panel, where the light shielding layer 106 includes a plurality of light shielding structures BM extending in the column direction Y, and the light shielding structures BM fill gaps between the lenses 104, such that light irradiated to the gaps of all the lenses 104 is blocked by the light shielding structures BM, and interference to each viewpoint is avoided.

Figure 4:
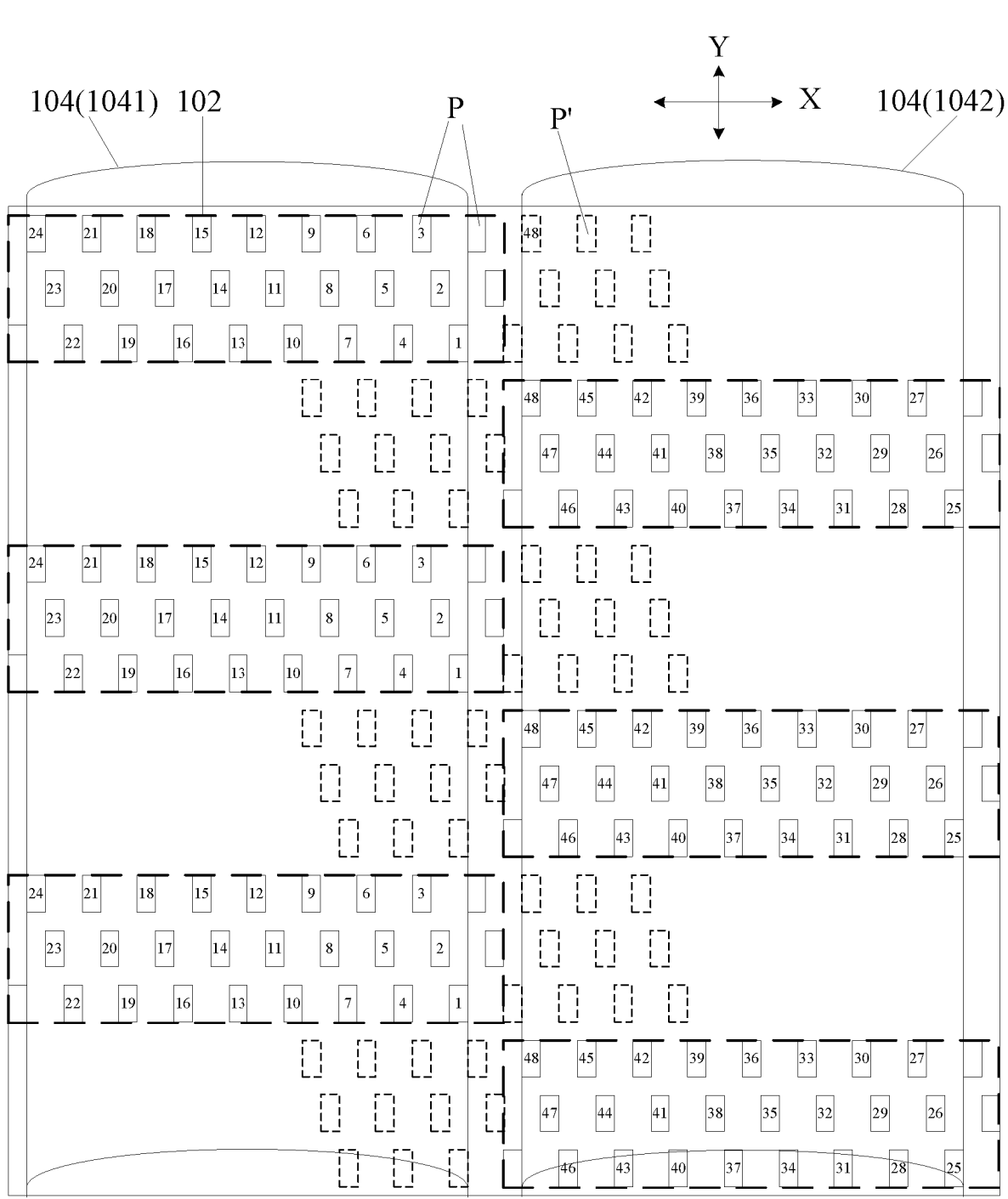
FIG. 4 is another schematic structural diagram of an area where one pixel repeating unit is located according to an embodiment of the present disclosure.

Optionally, in the display apparatus provided in the embodiments of the present disclosure, in order to reduce a tolerance requirement and prevent moire patterns caused by black areas generated by process deviation, as shown in FIG. 4, a plurality of redundant sub-pixels P' may be further arranged, and the redundant sub-pixels P' are arranged in the same row as at least part of sub-pixels P corresponding to one lens 104 (for example, the first lens 1041) in the light-splitting repeating unit 105, and are arranged in the same column as at least part of sub-pixels P corresponding to another lens 104 (for example, the second lens 1042), that is, an arrangement mode of the redundant sub-pixels P' may be the same as that of the sub-pixels P included in the pixel islands 102.

It should be noted that the arrangement mode of the redundant sub-pixels P' is the same as that of the sub-pixels P included in the pixel islands 102, such that for a same lens 104, under the condition that the light-emitting sub-pixel (for example, the 48th light-emitting sub-pixel 48) is damaged, the redundant sub-pixel P' (for example, the redundant sub-pixel P' numbered 48) at the same relative position as the damaged light-emitting sub-pixel relative to the lens 104 may be lit, so as to replace the damaged light-emitting sub-pixel (for example, the 48th light-emitting sub-pixel 48) with the redundant sub-pixel P' (for example, the redundant sub-pixel P' numbered 48). Since a position of the redundant sub-pixel P' (for example, the redundant sub-pixel P' numbered 48) and a position of the damaged light-emitting sub-pixel (for example, the 48th light-emitting sub-pixel 48) relative to the same lens 104 are the same, emitted rays of the redundant sub-pixel and the damaged light-emitting sub-pixel may form the same viewpoint in space after passing the lens 104.

Figure 5:
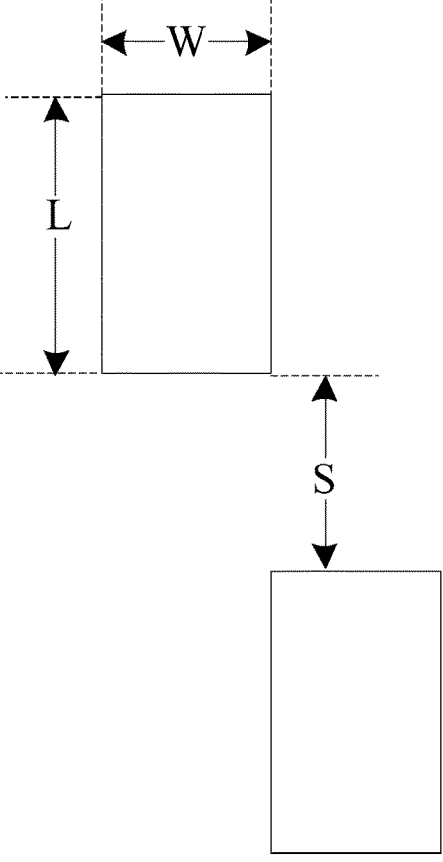
FIG. 5 is a schematic diagram of two sub-pixels in different rows and different columns in a pixel island according to an embodiment of the present disclosure.

In some embodiments, the display apparatus provided in the embodiments of the present disclosure is designed according to highest technological capacity of mini LED or micro LED at present, and a placement height is taken into account. As shown in FIG. 5, each sub-pixel P may have a width W of 6.5 μm-1000 μm in the row direction X, each sub-pixel P may have a length L of 10 μm-2000 μm in the column direction Y, and every two adjacent rows of sub-pixels P in the pixel islands 102 may have a distance S of 4 μm-1000 μm. For example, each sub-pixel P has a width W of 6.5 μm in the row direction X, each sub-pixel P has a length L of 10 μm in the column direction Y, and every two adjacent rows of sub-pixels P in the pixel islands 102 have a distance S of 4 μm.

Figure 6:
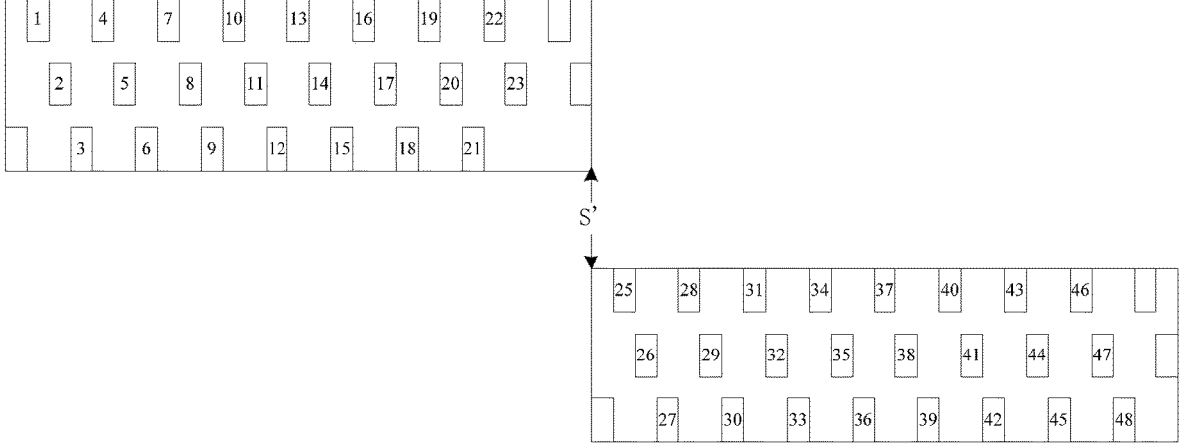
FIG. 6 is a schematic diagram of two pixel islands in different rows and different columns according to an embodiment of the present disclosure.

In some embodiments, in the display apparatus provided in the embodiments of the present disclosure, as shown in FIG. 6, according to process limits, any two adjacent rows of pixel islands 102 may have a distance S' greater than or equal to 70 μm, which is at least 70 μm, and for example, 75 μm.

The following table shows related data of a column of pixel islands 102 and the corresponding lens 104. It may be seen from the following table that a main lobe viewing angle formed in space after emitted rays of the pixel islands 102 pass the corresponding lens 104 is 24.74654°. In addition, in the present disclosure, after 24 viewpoints formed by two columns of pixel islands 102 corresponding to one light-splitting repeating unit 105 respectively are spliced, a whole viewing angle is actually about 44°.

| | |
|---|---|
| Sub-pixel pitch (mm) | 0.0065 |
| Light shielding structure (mm) | 0 |
| Viewing distance (mm) | 4000 |
| Viewpoint distance (mm) | 65 |
| The number of viewpoints N | 27 |
| High refractive index n of a lens | 1.61 |
| Low refractive index n' of a lens | 1 |
| Refractive index n1 of equivalent air layer | 1.5 |
| Focal length f of lens (mm) | 0.4 |
| Height of lens relative to pixel island (mm) | 0.6 |
| Horizontal caliber D of lens (mm) | 0.1754825 |
| Radius r of curvature of lens (mm) | 0.244 |
| Arc height h of lens (mm) | 0.0163215 |
| Main lobe width (mm) | 1755 |
| Inclination angle of lens (°) | 90 |
| Main lobe viewing angle (°) | 24.74654 |
| Shrinking percentage of lens | 0.9999 |

In some embodiments, in the display apparatus provided in the embodiments of the present disclosure, as shown in FIG. 2, in two columns of pixel islands 102 corresponding to the same light-splitting repeating unit 105, every six pixel islands 102 arranged in sequence in the column direction Y constitute a pixel repeating unit 107; and in one pixel repeating unit 107, six pixel islands 102 display three colors, and every two adjacent pixel islands 102 arranged in sequence in the column direction Y display the same color, such that light-emitting colors of three light-emitting sub-pixels of the same viewpoint in one pixel repeating unit 107 are different, and color picture display is achieved. For example, in FIG. 2, in the column direction Y, the first two pixel islands 102 display red, the middle two pixel islands 102 display green, and the last two pixel islands 102 display blue. In some embodiments, a size of one pixel repeating unit 107 may be 702 μm*702 μm.

In some embodiments, according to current process limits of mini LED, at most 426 pixel islands 102 may be designed in the row direction X, and at most 240 pixel islands 102 may be designed in the column direction Y, such that a display screen having a width of 299.052 mm in the row direction X and a length of 168.48 mm in the column direction Y may be obtained, that is, the pixel islands 102 may be spliced into a display screen of 13.51 inches. A larger display panel 101 may be obtained by splicing display screens of 13.51 inches, and large-viewing-angle light field display may be achieved by combining the lenses 104.

It should be noted that in the display apparatus provided in the embodiments of the present disclosure, splicing of the main lobe viewing angles may be achieved on the basis of a large-sized or medium-sized spliced panel in the related art, and a structure of pixel islands 102 included in the display panel 101 may also be designed for splicing viewing angles. Specifically, the large-sized or medium-sized spliced panel in the related art generally includes whole rows and whole columns of sub-pixels P arranged in a matrix (which is equivalent to that gaps between the sub-pixels P included in the pixel islands 102 shown in FIG. 2 and gaps between adjacent pixel islands 102 are also provided with inactive sub-pixels P). In this case, required sub-pixels P (for example, sub-pixels P shown in FIG. 2) may be found on the large-sized or medium-sized spliced panel in the related art according to spatial arrangement positions of viewpoints, so as to form the pixel islands 102. However, when the structure of the pixel islands 102 included in the display panel 101 is designed for splicing of viewing angles, actual arrangement of the sub-pixels P of the display panel 101 is as shown in FIG. 2, that is, only the sub-pixels P are made at positions required by the design, and the remaining positions are left blank. Both the above methods may achieve an effect of large-viewing-angle light field display through splicing of viewing angles.

Apparently, those skilled in the art can make various modifications and variations to the embodiments of the present disclosure without departing from the spirit and scope of the embodiments of the present disclosure. In this way, if these modifications and variations of the embodiments of the present disclosure fall within the scope of the claims of the present disclosure and their equivalent technologies, the present disclosure is also intended to include these modifications and variations.

What is claimed is:

1. A display apparatus, comprising:
   a display panel comprising a plurality of pixel islands arranged at intervals in a row direction and a column direction; wherein odd rows of pixel islands and even rows of pixel islands are staggered in the row direction, and adjacent boundaries, extending in the column direction, of any two adjacent odd and even columns of pixel islands are colinearly arranged; and wherein each of the plurality of pixel islands comprises a plurality of sub-pixels arranged at intervals in the row direction and the column direction, rows of sub-pixels in each pixel island are staggered in sequence row by row in the row direction, and adjacent boundaries of any two adjacent columns of sub-pixels extending in the column direction are colinearly arranged; and
   a light-splitting assembly located at a display surface side of the display panel and comprising a plurality of lenses extending in the column direction and arranged at intervals in the row direction; wherein a long axis of each of the plurality of lenses is parallel to the column direction; wherein every two adjacent lenses constitute a light-splitting repeating unit; and one lens is arranged corresponding to one column of pixel islands; wherein in two columns of pixel islands corresponding to the light-splitting repeating unit, a viewing angle formed in space by emergent rays generated after emitted rays of light-emitting sub-pixels comprised in one of the two column of pixel islands pass through a corresponding one of the two adjacent lenses in the light-splitting repeating unit is a first main lobe viewing angle, a viewing angle formed in space by emergent rays generated after emitted rays of light-emitting sub-pixels comprised in the other one of the two column of pixel islands pass through the other one of the two adjacent lenses in the light-splitting repeating unit is a second main lobe viewing angle, and maximum coverage boundaries of the first and second main lobe viewing angles in space are in direct contact with each other with no overlapping area.

2. The display apparatus according to claim 1, wherein the plurality of sub-pixels comprise light-emitting sub-pixels and floating sub-pixels, wherein in each row of sub-pixels of each pixel island, a distance between a light-emitting sub-pixel and a central axis, extending in the column direction, of the pixel island is smaller than a distance between a floating sub-pixel and the central axis, extending in the column direction, of the pixel island.

3. The display apparatus according to claim 2, wherein the lens cover light-emitting sub-pixels of corresponding pixel islands and do not cover floating sub-pixels of the corresponding pixel islands, and a central axis, extending in the column direction, of the lens deviates from a central axis, extending in the column direction, of a corresponding column of pixel islands.

4. The display apparatus according to claim 3, wherein viewpoints formed after emitted rays of light-emitting sub-pixels corresponding to the light-splitting repeating unit pass respective corresponding lenses are arranged in sequence in the row direction in space.

5. The display apparatus according to claim 4, wherein relative to the light-splitting repeating unit, emitted rays of light-emitting sub-pixels at same positions of a plurality of pixel islands included in the light-splitting repeating unit pass the respective corresponding lenses and form a viewpoint.

6. The display apparatus according to claim 2, wherein the pixel island comprises 27 sub-pixels, the 27 sub-pixels are arranged in 3 rows and 27 columns, and each row of sub-pixels comprise 8 light-emitting sub-pixels and 1 floating sub-pixel.

7. The display apparatus according to claim 2, wherein an emitted ray of the light-emitting sub-pixel having a smallest distance to the floating sub-pixel in each pixel island is totally reflected on a lens corresponding to an adjacent pixel island in the row direction.

8. The display apparatus according to claim 7, further comprising:
   a light shielding layer located at a side of the light-splitting assembly facing away from the display panel, wherein the light shielding layer comprises a plurality of light shielding structures extending in the column direction, and the light shielding structures fill gaps between the lenses.

9. The display apparatus according to claim 2, further comprising a plurality of redundant sub-pixels, wherein the plurality of redundant sub-pixels are arranged in same rows as at least part of the sub-pixels corresponding to one lens of the light-splitting repeating unit and in same columns as at least part of the sub-pixels corresponding to another lens of the light-splitting repeating unit.

10. The display apparatus according to claim 1, wherein each sub- pixel has a width of 6.5 μm-1000 μm in the row direction, each sub-pixel has a length of 10 μm-2000 μm in the column direction, and every two adjacent rows of sub-pixels in the pixel islands have a distance of 4 μm-1000 μm.

11. The display apparatus according to claim 1, wherein every two adjacent rows of pixel islands have a distance greater than or equal to 70 μm.

12. The display apparatus according to claim 1, wherein the display panel comprises a plurality of spliced mini light emitting diode (LED) display screens or a plurality of spliced micro LED display screens.

13. The display apparatus according to claim 1, wherein in the two columns of pixel islands corresponding to the light-splitting repeating unit, every six pixel islands arranged in sequence in the column direction constitute a pixel repeating unit; and in one pixel repeating unit, the six pixel islands display three colors, and every two adjacent pixel islands arranged in sequence in the column direction display a same color.

\* \* \* \* \*